United States Patent
Tsurumi

(10) Patent No.: US 8,193,863 B2
(45) Date of Patent: Jun. 5, 2012

(54) PUSH-PULL OUTPUT CIRCUIT

(75) Inventor: Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/887,312

(22) Filed: Sep. 21, 2010

(65) Prior Publication Data
US 2011/0163809 A1    Jul. 7, 2011

(30) Foreign Application Priority Data

Jan. 5, 2010    (JP) ................................. 2010-000745

(51) Int. Cl.
*H03F 3/18*    (2006.01)
(52) U.S. Cl. ....................................... 330/264; 330/267
(58) Field of Classification Search .................. 330/255, 330/263, 264, 267, 269
See application file for complete search history.

(56) References Cited

U.S. PATENT DOCUMENTS

| | | | |
|---|---|---|---|
| 5,216,381 A | 6/1993 | Botti et al. | |
| 5,606,281 A | 2/1997 | Gloaguen | |
| 5,659,266 A * | 8/1997 | Shacter et al. | 330/267 |
| 5,786,731 A * | 7/1998 | Bales | 330/267 |
| 7,242,250 B2 | 7/2007 | Tsurumi | |
| 7,420,413 B2 | 9/2008 | Tsurumi | |
| 7,557,659 B2 * | 7/2009 | Harvey | 330/257 |

FOREIGN PATENT DOCUMENTS

| | | |
|---|---|---|
| JP | P4030277 | 3/1992 |
| JP | 2002-353746 | 12/2002 |

OTHER PUBLICATIONS

Background Art Information.

* cited by examiner

*Primary Examiner* — Khanh Nguyen
(74) *Attorney, Agent, or Firm* — Knobbe, Martens, Olson & Bear, LLP

(57) ABSTRACT

According to one embodiment, a first transistor is connected between a first power supply rail and an output unit. A second transistor is connected between the output unit and a second power supply rail. A gm amplifier includes an input unit and first and second output terminals and amplifies a difference between a signal input to the input unit and a reference voltage. First and second current mirror circuits are connected to be vertically stacked between the first rail and the first terminal as well as a gate of the second transistor. Third and fourth current mirror circuits are connected to be vertically stacked between the second rail and the second terminal as well as a gate of the first transistor. The gate of the first transistor is connected to the first and second circuits. The gate of the second transistor is connected to the third and fourth circuits.

9 Claims, 12 Drawing Sheets

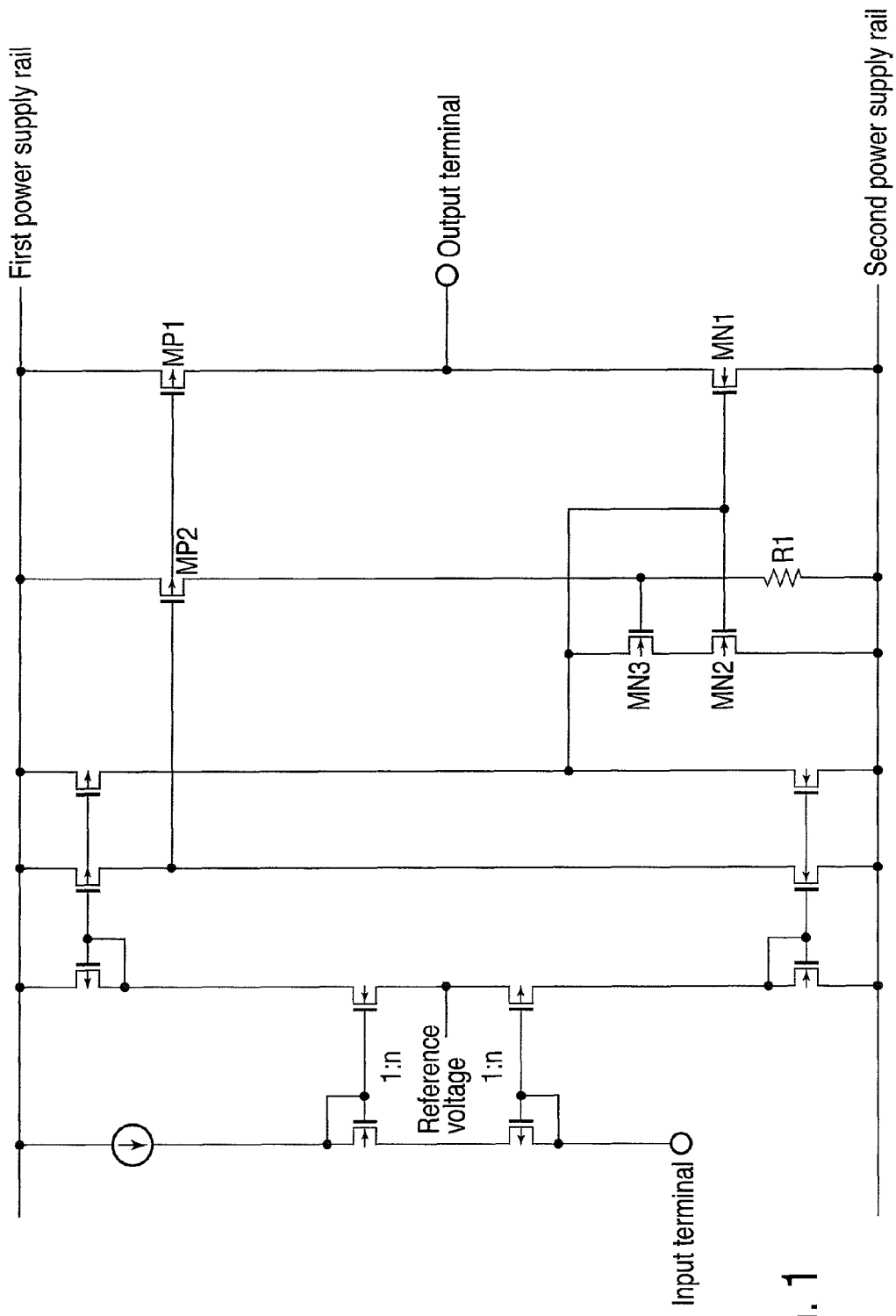
F I G. 1

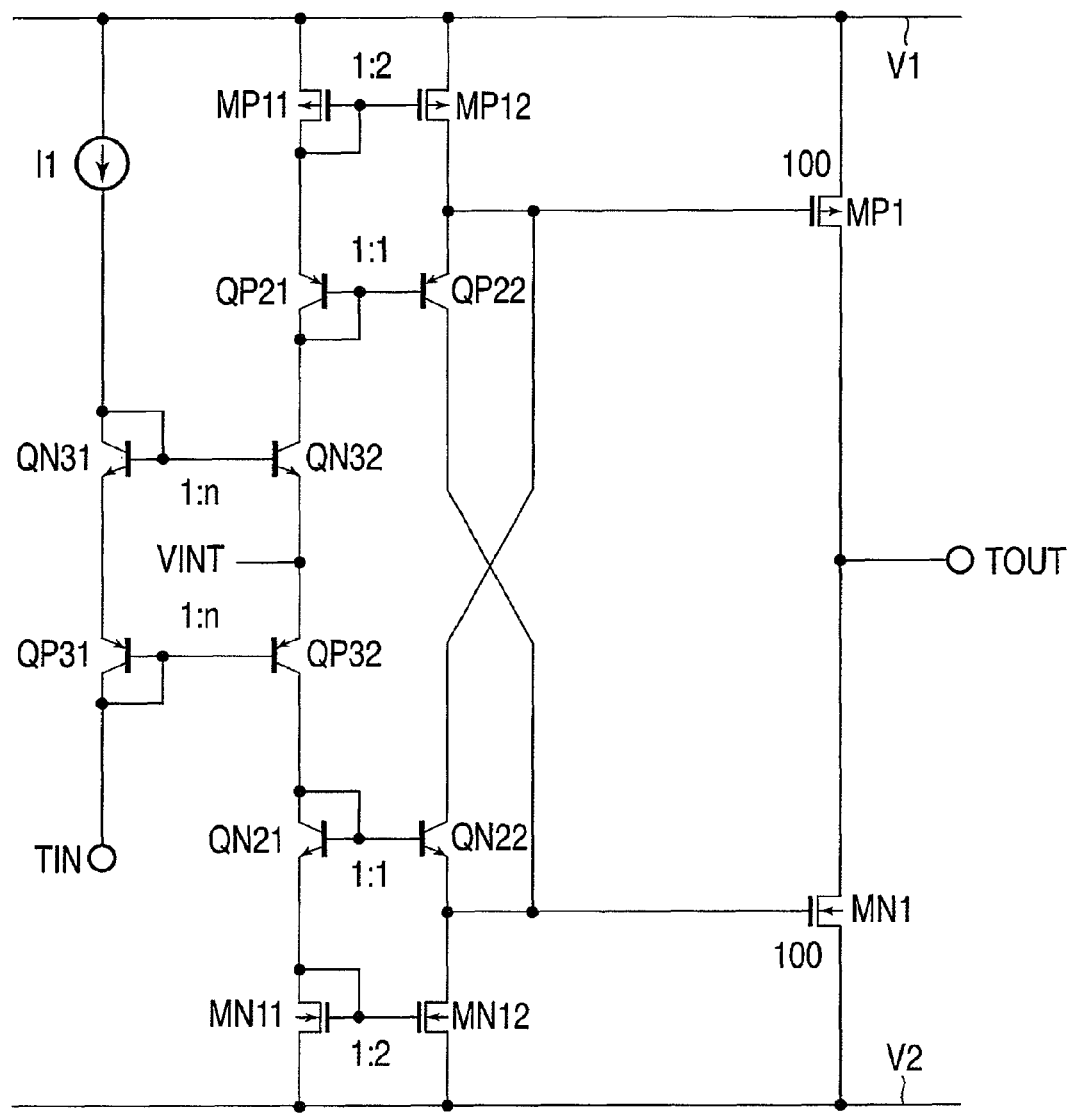
F I G. 6

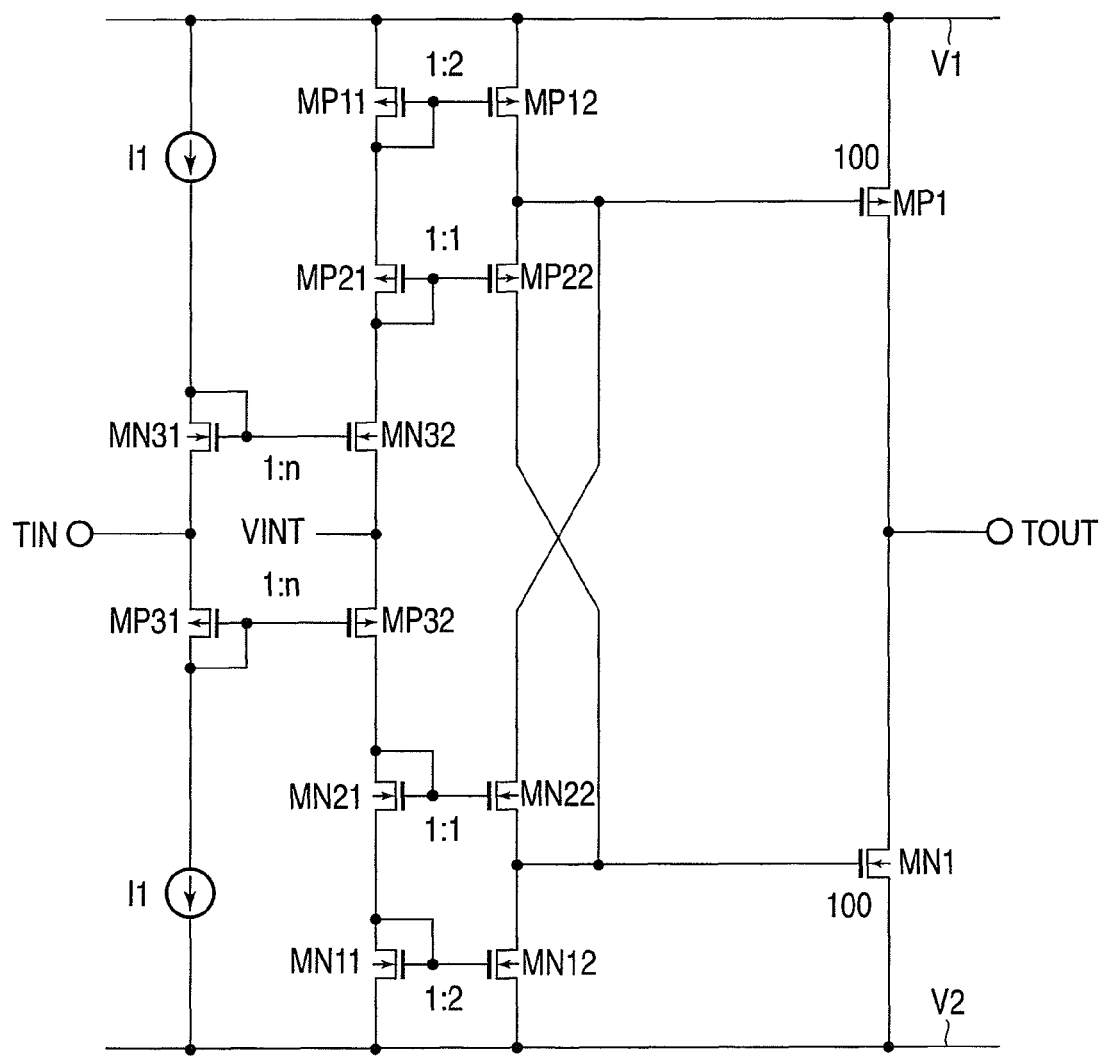
F I G. 7

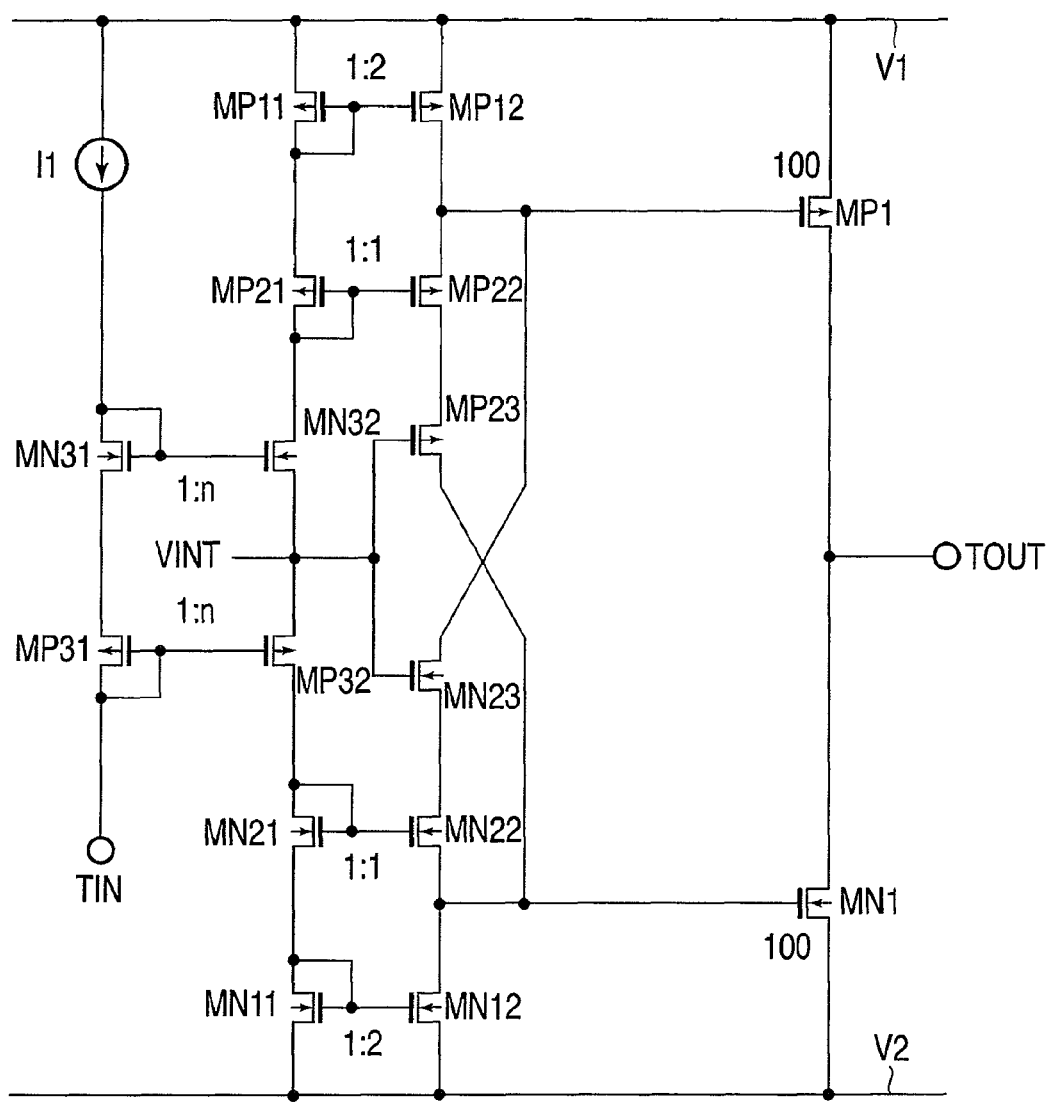
F I G. 8

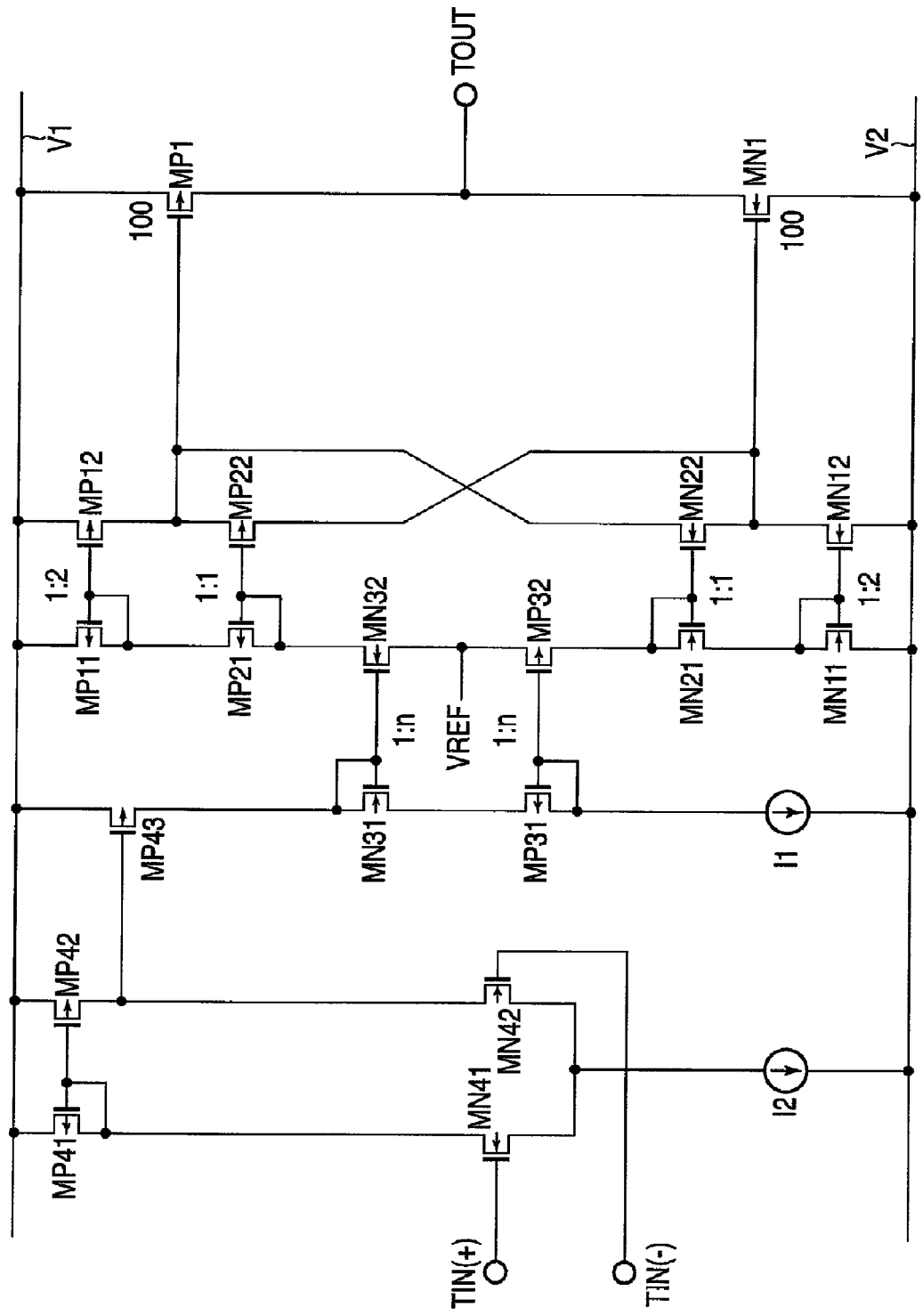
F I G. 10

PUSH-PULL OUTPUT CIRCUIT

CROSS-REFERENCE TO RELATED APPLICATIONS

This application is based upon and claims the benefit of priority from Japanese Patent Application No. 2010-000745, filed Jan. 5, 2010; the entire contents of which are incorporated herein by reference.

FIELD

Embodiments described herein relate generally to a push-pull output circuit. The push-pull output circuit is used, for example, in a power amplifier circuit.

BACKGROUND

One example of a conventional MOS output circuit is described in, for example, the specification of Japanese Patent No. 4030277. According to this MOS output circuit, a change in the gate impedance of an output transistor in a no-signal condition and during signal input can be reduced by a simple configuration. Thus, a low-strain analog MOS amplifier circuit can be obtained without any increase in chip size.

However, because of the action of a circuit which comprises, for example, a MOS transistor and a resistance and which is configured to determine an idle current in the absence of any input signal, the gate impedance of a p-channel output transistor and the gate impedance of an n-channel output transistor cannot be said to be equal to each other. Therefore, even if a drive circuit at a previous stage drives these output transistors by equal currents, the transfer characteristic of this output circuit considerably varies depending on whether a positive input signal or a negative input signal is applied thereto.

That is, the drawback of the conventional circuit is that a drive circuit of a push (p-channel) output transistor and a drive circuit of a pull (n-channel) output transistor have low symmetry, so that the transfer characteristics of these output transistors when driven have low symmetry.

BRIEF DESCRIPTION OF THE DRAWINGS

FIG. 1 is a circuit diagram showing one example of a MOS output circuit as a comparative example;

FIG. 6 is a circuit diagram showing the detailed configuration of an output circuit according to a second embodiment;

FIG. 7 is a circuit diagram showing the detailed configuration of an output circuit according to a third embodiment;

FIG. 8 is a circuit diagram showing the detailed configuration of an output circuit according to a fourth embodiment;

FIG. 10 is a circuit diagram showing the detailed configuration of an operational amplifier according to a sixth embodiment;

DETAILED DESCRIPTION

Before describing embodiments, a comparative example to the embodiments is described.

One example of a MOS output circuit as the comparative example is shown in FIG. 1. According to this MOS output circuit, a change in the gate impedance of an output transistor in a no-signal condition and during signal input can be reduced by a simple configuration. Thus, a low-strain analog MOS amplifier circuit can be obtained without any increase in chip size.

However, because of the action of a circuit which comprises a MOS field-effect transistor (MOSFET) (hereinafter referred to as a MOS transistor) MP2, a resistance R1 and a MOS transistor MN2, MN3 and which is configured to determine an idle current in the absence of any input signal, the gate impedance of an output transistor MN1 and the gate impedance of an output transistor MP1 cannot be said to be equal to each other. Therefore, even if a drive circuit at a previous stage drives the output transistors MN1, MP1 by equal currents, the transfer characteristic of this output circuit considerably varies depending on whether the output circuit is driven by a positive input signal or a negative input signal.

Figure 2:
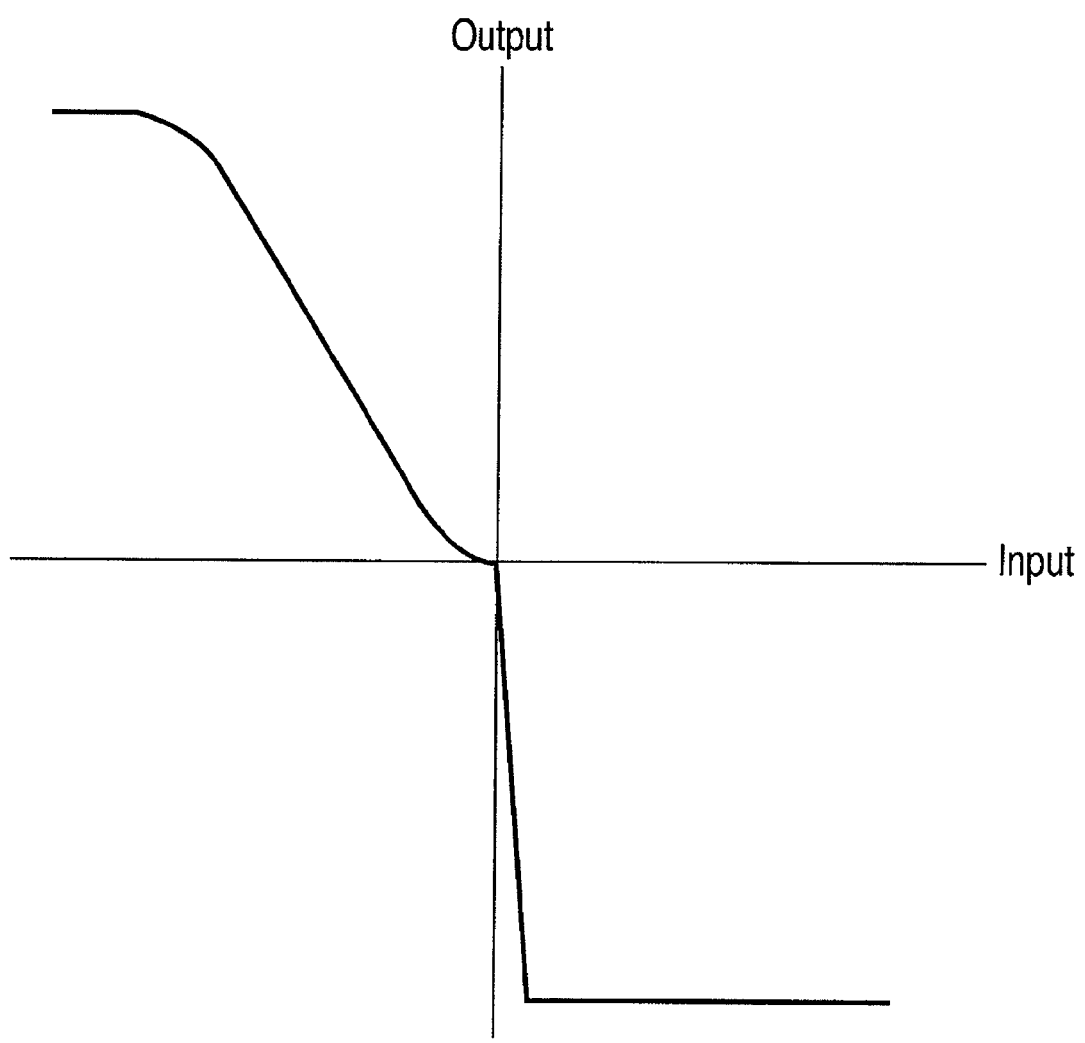
FIG. 2 is a graph showing the transfer characteristic of the output circuit shown in FIG. 1.

The transfer characteristic of the output circuit shown in FIG. 1 is shown in FIG. 2. The lower right half plane (second quadrant) of FIG. 2 indicates the transfer characteristic of the output transistor MN1 when driven. This characteristic shows an extremely steep inclination. On the other hand, the lower left half plane (fourth quadrant) indicates the transfer characteristic of the output transistor MP1 when driven.

Thus, in the circuit shown in FIG. 1, a drive circuit of a p-channel output transistor and a drive circuit of an n-channel output transistor have low symmetry, so that the transfer characteristics of these output transistors when driven also have low symmetry.

The embodiments are described below with reference to the drawings. In the description, like reference numbers are given to like parts throughout the drawings.

In general, according to one embodiment, an output circuit includes a first transistor, a second transistor, a gm amplifier, a first current mirror circuit, a second current mirror circuit, a third current mirror circuit and a fourth current mirror circuit. The first transistor is connected between a first power supply rail and an output unit. The second transistor is connected between the output unit and a second power supply rail. The gm amplifier includes an input unit and first and second output terminals and amplifies a difference between a signal input to the input unit and a reference voltage. The first current mirror circuit and the second current mirror circuit are connected to be vertically stacked between the first power supply rail and the first output terminal of the gm amplifier as well as a gate of the second transistor. The third current mirror circuit and the fourth current mirror circuit are connected to be vertically stacked between the second power supply rail and the second output terminal of the gm amplifier as well as a gate of the first transistor. The gate of the first transistor is connected to a connection point between the first current mirror circuit and the second current mirror circuit. The gate of the second transistor is connected to a connection point between the third current mirror circuit and the fourth current mirror circuit.

[1] Principle/Configuration of Embodiments

First, the principle/configuration of the embodiments are described.

Figure 3:
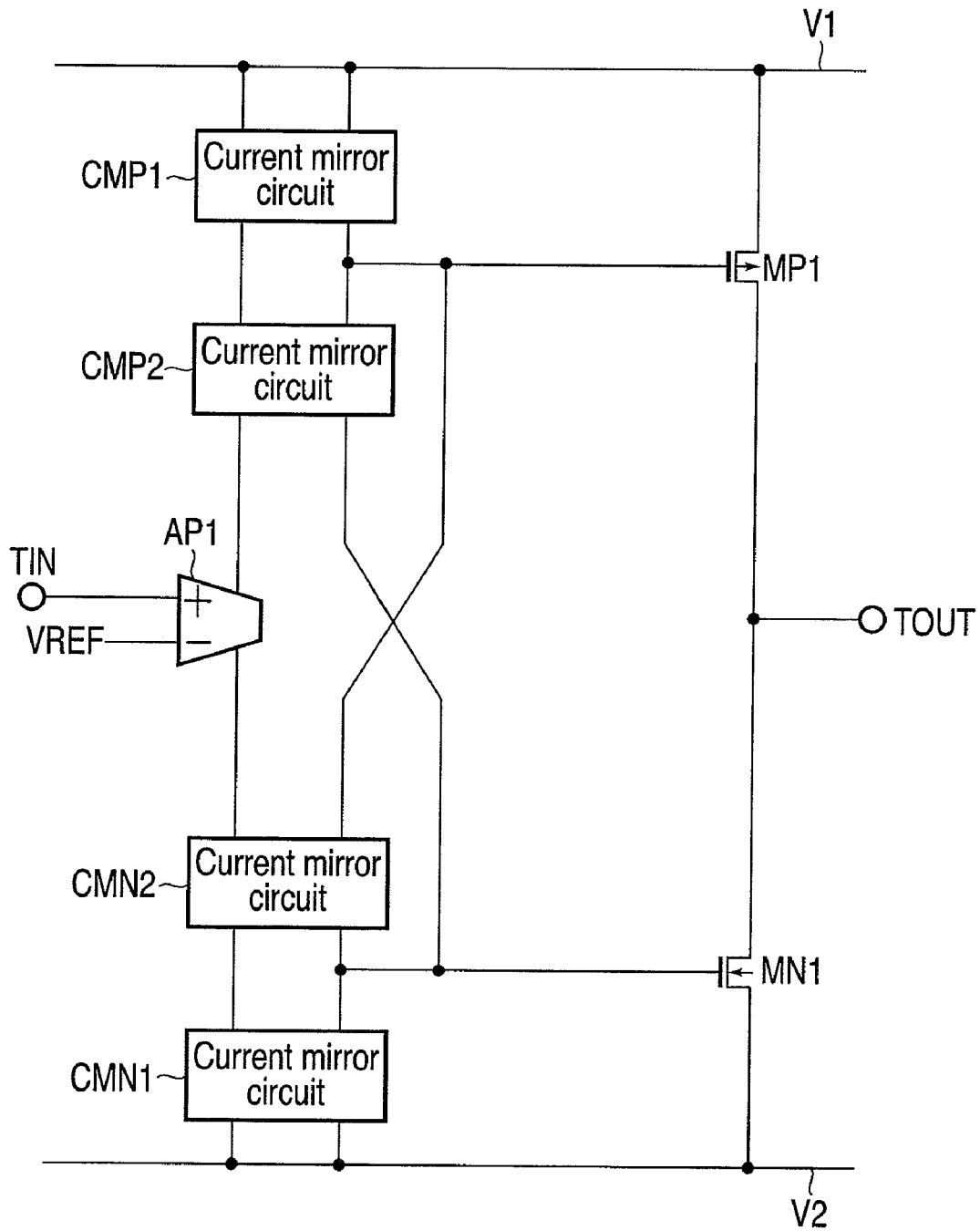
FIG. 3 is a circuit diagram showing the principle/configuration of an output circuit according to embodiments.

FIG. 3 is a circuit diagram showing the principle/configuration of an output circuit according to the embodiments.

As shown, the output circuit comprises output transistors such as a p-channel DMOS transistor MP1 and an n-channel DMOS transistor MN1, a transfer conductance (gm) amplifier AP1, current mirror circuits CMP1, CMP2, CMN1, CMN2, a first power supply rail V1, a second power supply rail V2, an input terminal TIN and an output terminal TOUT.

The output transistor MP1 is connected between the first power supply rail V1 and the output terminal TOUT. The output transistor MN1 is connected between the output terminal TOUT and the second power supply rail V2. The first power supply rail V1 is supplied with, for example, a power supply voltage VDD. The second power supply rail V2 is supplied with, for example, a ground potential Vss.

The gm amplifier AP1 has first and second output terminals, and amplifies a potential difference between a voltage input to the input terminal TIN and a reference voltage VREF.

The current mirror circuits CMP1, CMP2 are vertically stacked between the first power supply rail V1 and a first output terminal of the gm amplifier AP1 as well as a gate of the output transistor MN1. The current mirror circuits CMN1, CMN2 are vertically stacked between the second power supply rail V2 and a second output terminal of the gm amplifier AP1 as well as a gate of the output transistor MP1.

Furthermore, the gate of the output transistor MP1 is connected to a connection point of a controlled terminal between current mirror circuits CMP1, CMP2. The gate of the output transistor MN1 is connected to a connection point of a controlled terminal between current mirror circuits CMN1, CMN2.

In the first to eighth embodiments below, detailed circuit configurations are described to explain the overview of the embodiments in detail.

[2] First Embodiment

Figure 4:
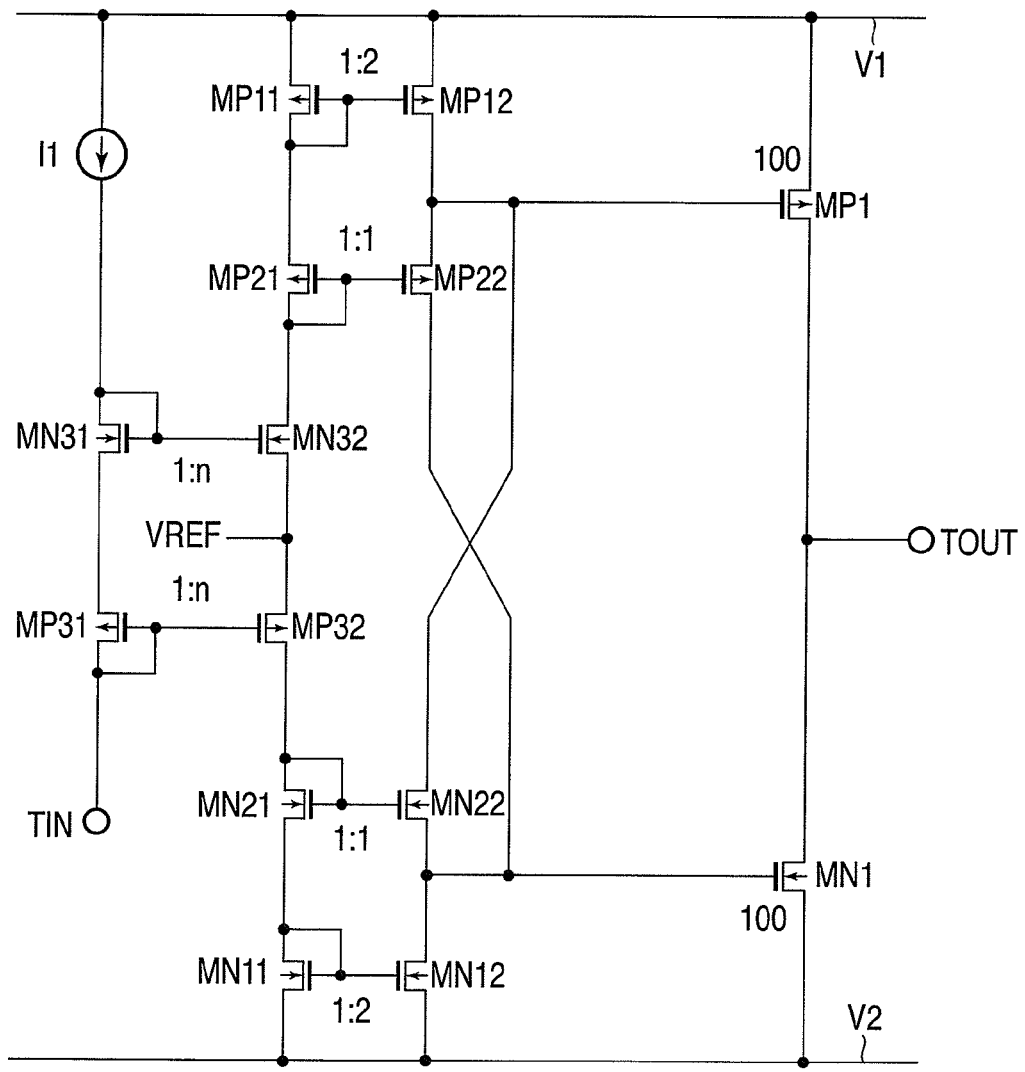
FIG. 4 is a circuit diagram showing the detailed configuration of an output circuit according to a first embodiment.

An output circuit according to the first embodiment is described. FIG. 4 is a circuit diagram showing the detailed configuration of the output circuit according to the first embodiment.

[2-1] Circuit Configuration

As shown in FIG. 4, a gm amplifier AP1 comprises an input terminal TIN, a reference voltage VREF, n-channel MOS transistors MN31, MN32, p-channel MOS transistors MP31, MP32 and a current source I1.

A current mirror circuit CMP1 comprises p-channel MOS transistors MP11, MP12. A current mirror circuit CMP2 comprises p-channel MOS transistors MP21, MP22. A current mirror circuit CMN1 comprises n-channel MOS transistors MN11, MN12. A current mirror circuit CMN2 comprises n-channel MOS transistors MN21, MN22.

A gate of an output transistor MP1 connected between a first power supply rail V1 and an output terminal TOUT is connected between MOS transistors MP12, MP22 and also connected to a drain of MOS transistor MN22. A gate of an output transistor MN1 connected between a second power supply rail V2 and the output terminal TOUT is connected between MOS transistors MN12, MN22 and also connected to a drain of MOS transistor MP22.

[2-2] Circuit Operation

Now, the operation of the output circuit according to the first embodiment is described. The area ratio of the transistors is set as shown in FIG. 4, and it is assumed that n=1.

(A) When No Alternating-Current (AC) Signal is Input to the Input Terminal

When there is no alternating-current (AC) signal (zero input) at the input terminal TIN, a DC bias that allows a voltage across MOS transistor MN31 and MOS transistor MP31 to be equal to the reference voltage is applied to the input terminal TIN. This DC bias may be a voltage source or current source as long as the above-mentioned requirements are fulfilled.

When there is no input, currents flowing through the MOS transistors MN31, MN32 are equal to the current I1. Currents flowing through the MOS transistors MP31, MP32 are also equal to the current I1.

The current I1 equally flows through the MOS transistors MP11, MP21, MN21, MN11. The area ratio of the MOS transistors MN11, MN12 is 1:2. The area ratio of the MOS transistors MP11, MP12 is also 1:2. Therefore, a current (2×I1) flows through the MOS transistors MN12 and MP12.

Then, currents flowing through the MOS transistor MP22 and the MOS transistor MN22 are found. To this end, it is first assumed that the current flowing through the MOS transistor MP22 is the current I1.

In this case, since the current (2×I1) flows through the MOS transistor MN12, the current I1 which is a difference between the above currents flows through the MOS transistor MN22. On the other hand, the current flowing through the MOS transistor MP12 is also the current (2×I1), so that the current I1 flows through the MOS transistor MP22, which corresponds to the foregoing assumption.

Thus, the currents flowing through the MOS transistors MN21, MN22 are equal to the current I1, and the currents flowing through the MOS transistors MP21, MP22 are also equal to the current I1.

Therefore, gate-source voltages of the MOS transistor MN21 and the MOS transistor MN22 are equal to each other, and a gate voltage of the MOS transistor MN11 is equal to a gate voltage of the MOS transistor MN1.

On the other hand, gate-source voltages of the MOS transistors MP21 and the MOS transistor MP22 are equal to each other, and a gate voltage of the MOS transistor MP11 is equal to a gate voltage of the MOS transistor MP1.

That is, the current flowing through the MOS transistor MN1 is determined by the area ratio of the MOS transistor MN11 to the MOS transistor MN1. Moreover, the current flowing through the MOS transistor MP1 is determined by the area ratio of the MOS transistor MP11 to the MOS transistor MP1. Here, the area ratios MN11:MN1 and MP11:MP1 are 1:100, so that an idle current when there is no input to the input terminal TIN is a current (100×I1).

Meanwhile, in the above explanation of the determination of the current, the currents flowing through the MOS transistors MN22, MP22 are equal to each other and are the current I1. However, it is actually assumed that an error current $\Delta I$ is included. For example, if the current flowing through the MOS transistor MP22 is $I1+\Delta I$, the current flowing through the MOS transistor MN22 is $I1-\Delta I$.

In this case, the gate-source voltage of MOS transistor MN22 is smaller by a voltage $\Delta V$ than the gate-source voltage of MOS transistor MN21. On the other hand, the gate-source voltage of MOS transistor MP22 is greater by the voltage $\Delta V$ than the gate-source voltage of MOS transistor MP21. Here, the voltage ΔV can be considered to be a value obtained by dividing the current I1 by a transfer conductance gm of each transistor.

Thus, the gate voltage of MOS transistor MN1 is "Vgs(MN11)+ΔV", and the gate voltage of MOS transistor MP1 is "Vgs(MP11)−ΔV". As a result, the current flowing through the MOS transistor MN1 is greater than 100×I1, and the current flowing through the MOS transistor MP1 is smaller than 100×I1.

However, in general, the output voltage of the output terminal TOUT of a power amplifier circuit shown in FIG. 4 can be stabilized at a desired intermediate voltage by a resistive feedback circuit. In other words, in order to keep the output of the output terminal at the intermediate voltage, the voltage of the input terminal can be adjusted by the action of the feedback circuit so that the current difference between MOS transistors MN1 and MP1 may be zero.

Thus, after all, the bias of the currents of MOS transistors MP1, MN1 stabilizes to be 100×I1. In this way, the output circuit according to the embodiment is characterized in that the idle current (current in the absence of any signal) of the output transistor is accurately determined by a simple configuration.

(B) When the AC Signal is Input to the Input Terminal

When a signal in a positive direction is applied to the input terminal TIN, a connection point between the MOS transistors MN31, MP31 is higher than the reference voltage VREF. Thus, the current of the MOS transistor MN32 becomes higher than the I1, while the current of the MOS transistor MP32 decreases.

Since the currents flowing through the MOS transistors MP11, MP21 increase, the current flowing through the MOS transistor MP12 also increases. On the other hand, since the currents flowing through the MOS transistors MN21, MN11 decrease, the current flowing through the MOS transistor MN12 also decreases.

One of the currents flowing through the MOS transistor MP22 and the MOS transistor MN22 is determined by the other. Here, it is assumed that the current flowing through MOS transistor MN22 has decreased.

In this case, the current flowing through MOS transistor MP22 becomes higher than the I1. Therefore, the gate-source voltage of MOS transistor MP1 becomes smaller than the gate-source voltage of MOS transistor MP11. That is, the gate-source voltage of MOS transistor MP1 becomes smaller than the voltage in the absence of any signal.

Furthermore, the current flowing through MOS transistor MN22 is lower the I1, and the current of MOS transistor MP22 increases. Thus, the gate-source voltage of MOS transistor MN1 becomes greater than the gate-source voltage of the MOS transistor MN11. That is, the gate-source voltage of the MOS transistor MN1 becomes greater than the voltage in the absence of any signal.

Therefore, when a signal in a positive direction is applied to the input terminal TIN, the current of the MOS transistor MP1 decreases, and the current of the MOS transistor MN1 increases. Thus, the output circuit operates so that the output terminal TOUT swings downward.

Here, the aforementioned assumption that the current flowing through the MOS transistor MN22 has decreased is obviously correct because the gate-source voltage of the MOS transistor MN1 becomes greater than the gate-source voltage of the MOS transistor MN11.

Furthermore, the case where a signal in a negative direction is applied to the input terminal TIN is as follows:

When a signal in a negative direction is applied to the input terminal TIN, the connection point between the MOS transistors MN31, MP31 is lower than the reference voltage VREF. Thus, the current of the MOS transistor MN32 becomes lower than the I1, while the current of the MOS transistor MP32 increases.

Since the currents flowing through the MOS transistors MP11, MP21 decrease, the current flowing through the MOS transistor MP12 also decreases. On the other hand, since the currents flowing through the MOS transistors MN21, MN11 increase, the current flowing through the MOS transistor MN12 also increases.

One of the currents flowing through the MOS transistor MP22 and the MOS transistor MN22 is determined by the other. Here, it is assumed that the current flowing through the MOS transistor MN22 has increased.

In this case, the current flowing through the MOS transistor MP22 becomes lower than the I1. Therefore, the gate-source voltage of the MOS transistor MP1 is greater than the gate-source voltage of the MOS transistor MP11. That is, the gate-source voltage of the MOS transistor MP1 becomes greater than the voltage in the absence of any signal.

Furthermore, the current flowing through the MOS transistor MN22 is higher the I1, and the current of the MOS transistor MP22 decreases. Thus, the gate-source voltage of the MOS transistor MN1 becomes smaller than the gate-source voltage of the MOS transistor MN11. That is, the gate-source voltage of the MOS transistor MN1 becomes smaller than the voltage in the absence of any signal.

Therefore, when a signal in a negative direction is applied to the input terminal TIN, the current of the MOS transistor MP1 increases, and the current of the MOS transistor MN1 decreases. Thus, the output circuit operates so that the output terminal TOUT swings upward.

Here, the aforementioned assumption that the current flowing through the MOS transistor MN22 has increased is obviously correct because the gate-source voltage of the MOS transistor MN1 becomes smaller than the gate-source voltage of the MOS transistor MN11.

As described above, the symmetry of the following operations is significantly high: the operation of a control circuit for controlling the gate voltages of the MOS transistors MP1, MN1 in the case where an input signal in a positive direction is applied in a no-signal condition, and the operation of a control circuit for controlling the gate voltages of the MOS transistors MP1, MN1 in the case where an input signal in a negative direction is applied.

Figure 5:
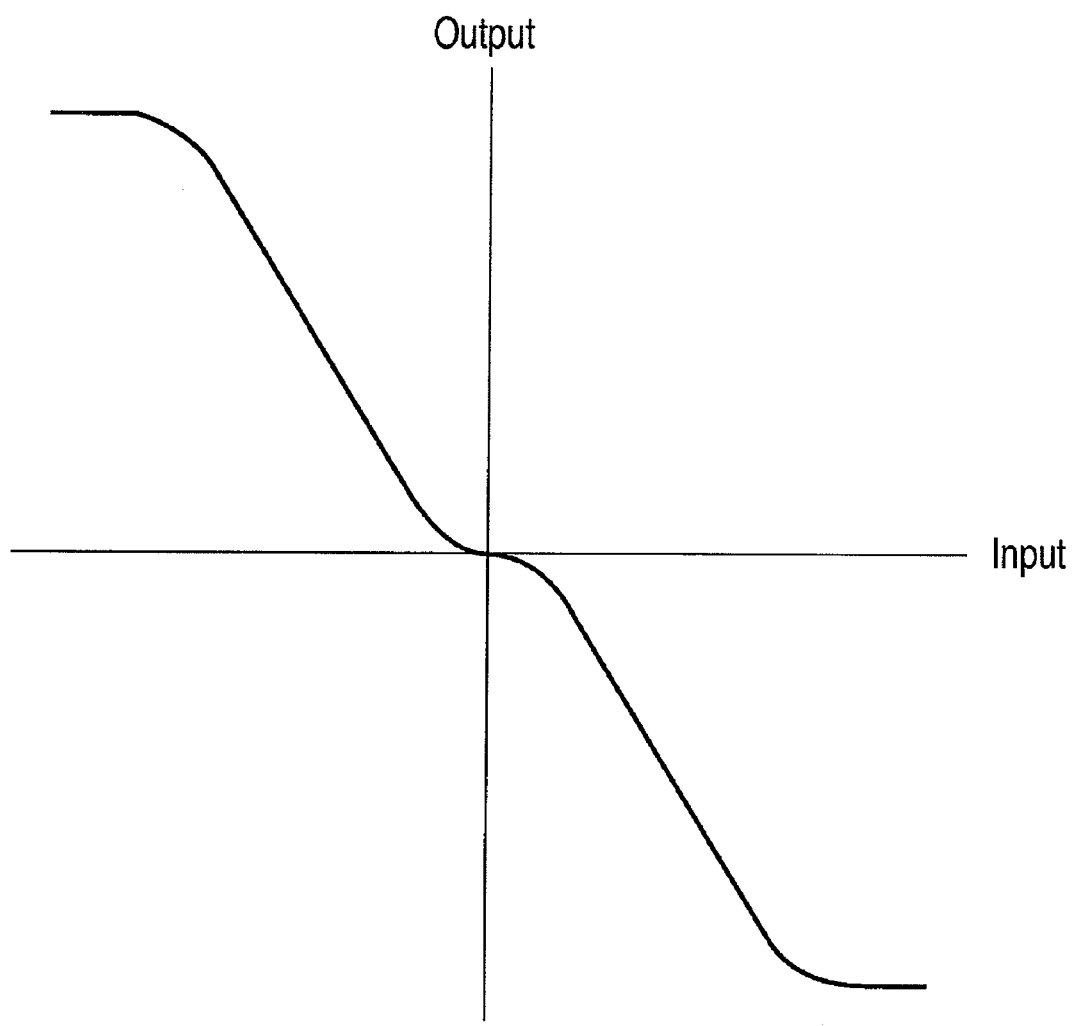
FIG. 5 is a graph showing the transfer characteristic of the output circuit according to the first embodiment.

This is as shown in FIG. 5 when represented by a so-called transfer characteristic in which a direct-current (DC) voltage applied to the input terminal is indicated in relation to the output voltage. That is, in the output circuit according to the present embodiment, a drive circuit of the p-channel output transistor and a drive circuit of the n-channel output transistor have high symmetry so that the transfer characteristics of the output transistors when driven have good symmetry. Thus, the use of the output circuit according to the present embodiment enables an audio amplifier circuit having high sound quality to be formed.

(C) When a High Input Signal is Applied to the Input Terminal

An operation when a higher input signal is applied to the input terminal TIN and the output terminal is clipped is described.

When a higher signal in a positive direction is applied to the input terminal TIN, the connection point between the MOS transistors MN31, MP31 becomes higher than the reference voltage VREF. The current of the MOS transistor MN32 considerably increases, while the current of the MOS transistor MP32 become substantially zero.

If the current of the MOS transistor MP32 becomes substantially zero, the currents of the MOS transistors MN21, MN11, MN22, MN12 also become substantially zero.

Conversely, since the current of the MOS transistor MN32 considerably increases, the currents of the MOS transistors MP11, MP21 also considerably increase, and the current of the MOS transistor MN22 is substantially zero. Therefore, the currents of the MOS transistors MP12, MP22 are substantially equal to double the currents flowing through the MOS transistors MP11, MP21.

The current of the MOS transistor. MP22 has considerably increased, and the current of the MOS transistor MN12 is zero. Thus, the gate-source voltage of the MOS transistor MN1 further increases. As far as the MOS transistor MP22 permits the passage of the current, the gate voltage of the MOS transistor MN1 reaches a higher voltage.

The gate voltage of the MOS transistors MP1 settles at a value slightly lower than the gate-source voltage of the MOS transistor MP11 because the currents of the MOS transistors MP21, MP22 are substantially equal to 1:2.

A high-speed discharge is possible when the gate voltage of the MOS transistor MP1 is thus discharged by the current of the MOS transistor MP12. Moreover, if the gate voltage of the MOS transistors MN1 is charged by the current of the MOS transistor MP22, high-speed charging is possible, and a great maximum value of the gate voltage of the MOS transistors MN1 can be obtained.

Furthermore, when a higher signal in a negative direction is applied to the input terminal TIN, the connection point between the MOS transistors MN31, MP31 is lower than the reference voltage VREF. The current of the MOS transistor MP32 considerably increases, while the current of the MOS transistor MN32 becomes substantially zero.

If the current of the MOS transistor MN32 becomes substantially zero, the currents of the MOS transistors MP21, MP11, MP22, MP12 also become substantially zero.

Conversely, since the current of the MOS transistor MP32 considerably increases, the currents of the MOS transistors MN11, MN21 also considerably increase, and the current of the MOS transistor MP22 is substantially zero. Therefore, the currents of the MOS transistors MN12, MN22 are substantially equal to double the currents flowing through the MOS transistors MN11, MN21.

The current of the MOS transistor MN22 has considerably increased, and the current of the MOS transistor MP12 is zero. Thus, the gate-source voltage of the MOS transistor MP1 further increases. As far as the MOS transistor MN22 permits the passage of the current, the gate voltage of, the MOS transistor MP1 reaches a low voltage.

The gate voltage of the MOS transistors MN1 settles at a value slightly lower than the gate-source voltage of the MOS transistor MN11 because the currents of the MOS transistors MN21, MN22 are substantially equal to 1:2.

A high-speed discharge is possible when the gate voltage of the MOS transistor MN1 is discharged by the current of the MOS transistor MN12. Moreover, if the gate voltage of the MOS transistors MP1 is charged by the current of the MOS transistor MN22, high-speed charging is possible, and a great maximum value of the gate voltage of the MOS transistors MP1 can be obtained.

As described above, the gate voltages of the MOS transistors MP1, MN1 can be charged at high speed when the output terminal is clipped, and can have great amplitude. Moreover, the gate voltages can also be discharged at high speed.

Thus, the gate voltage of each of the MOS transistors MP1, MN1 can have great amplitude, and high maximum output electric power can be obtained. Another advantage is that the gate voltages (gate capacitances) of the MOS transistors MP1, MN1 are not only charged but also discharged at high speed, thereby preventing the upper and lower MOS transistors MP1, MN1 from turning on at the same time.

As described above, according to the first embodiment, it is possible to provide an output circuit in which a drive circuit of a push (p-channel) output transistor and a drive circuit of a pull (n-channel) output transistor have high symmetry so that the transfer characteristics have good symmetry. The use of such an output circuit enables an audio amplifier circuit having high sound quality to be formed.

Furthermore, according to the first embodiment, an idle current (current in the absence of any signal) of the output transistor can be accurately determined by a simple configuration. Also, the gate voltage of each of the output transistors can have great amplitude, and high maximum output electric power can be obtained. Moreover, the idle current can be accurately determined, and power consumption can therefore be reduced.

Another advantage is that the gate voltages (gate capacitances) of the output transistors can be not only charged but also discharged at high speed, thereby preventing the upper and lower output transistors from turning on at the same time.

[3] Second Embodiment

An output circuit according to the second embodiment is described. FIG. 6 is a circuit diagram showing the detailed configuration of the output circuit according to the second embodiment.

[3-1] Circuit Configuration

In the second embodiment, the MOS transistors configuring the gm amplifier AP1 and the current mirror circuits CMP2, CMN2 in the first embodiment are replaced with bipolar transistors.

More specifically, as shown in FIG. 6, a gm amplifier AP1 comprises npn bipolar transistors QN31, QN32, pnp bipolar transistors QP31, QP32 and a current source I1. An intermediate voltage VINT is supplied between bipolar transistors QP31, QP32.

A current mirror CMP2 comprises pnp bipolar transistors QP21, QP22. A current mirror CMN1 comprises npn bipolar transistors QN21, QN22.

Other components are similar to those in the first embodiment. In addition, output transistors MP1, MN1, MOS transistors MP11, MP12 configuring the current mirror CMP2, and MOS transistors MN11, MN12 configuring the current mirror CMN2 that are shown in FIG. 6 may also be replaced with bipolar transistors.

Circuit operation and advantages in the output circuit according to the second embodiment are similar to those in the first embodiment and are not described.

[4] Third Embodiment

An output circuit according to the third embodiment is described. FIG. 7 is a circuit diagram showing the detailed configuration of the output circuit according to the third embodiment.

[4-1] Circuit Configuration

The third embodiment is different from the first embodiment in that a connection point between MOS transistors MN31, MP31 is an input terminal. Moreover, an intermediate voltage VINT is supplied between MOS transistors MN32, MP32.

As shown in FIG. 7, a gm amplifier AP1 comprises the MOS transistors MN31, MN32, MP31, MP32 and two current sources I1.

Circuit operation and advantages in the output circuit according to the third embodiment are similar to those in the first embodiment and are not described.

[5] Fourth Embodiment

An output circuit according to the fourth embodiment is described. FIG. 8 is a circuit diagram showing the detailed configuration of the output circuit according to the fourth embodiment.

[5-1] Circuit Configuration

The fourth embodiment is different from the first embodiment in that a MOS transistor MP23 cascoded to a MOS transistor MP22 and a MOS transistor MN23 cascoded to a MOS transistor MN22 are inserted.

A gate of the MOS transistor MN23 and a gate of the MOS transistor MP23 are generally connected to a reference voltage, but here, are connected to an intermediate voltage VINT. In addition, gate voltages of the MOS transistors MP23, MN23 do not necessarily have to correspond to each other.

Thus, when the MOS transistors MP23, MN23 are provided, MOS transistors MP12, MP22, MN12, MN22 can be operated without breaking down even if a higher voltage is applied across a first power supply rail V1 and a second power supply rail V2. For example, a DMOS transistor having a high drain-source breakdown voltage can be used for each MOS transistor. In this case, these transistors can be operated without breaking down even when a difference voltage of 50 V is supplied across the first power supply rail V1 and the second power supply rail V2.

Circuit operation and advantages in the output circuit according to the fourth embodiment are similar to those in the first embodiment and are not described.

Examples of applying the output circuit according to the first embodiment to an operational amplifier are described below as the fifth to eighth embodiments.

[6] Fifth Embodiment

Figure 9:
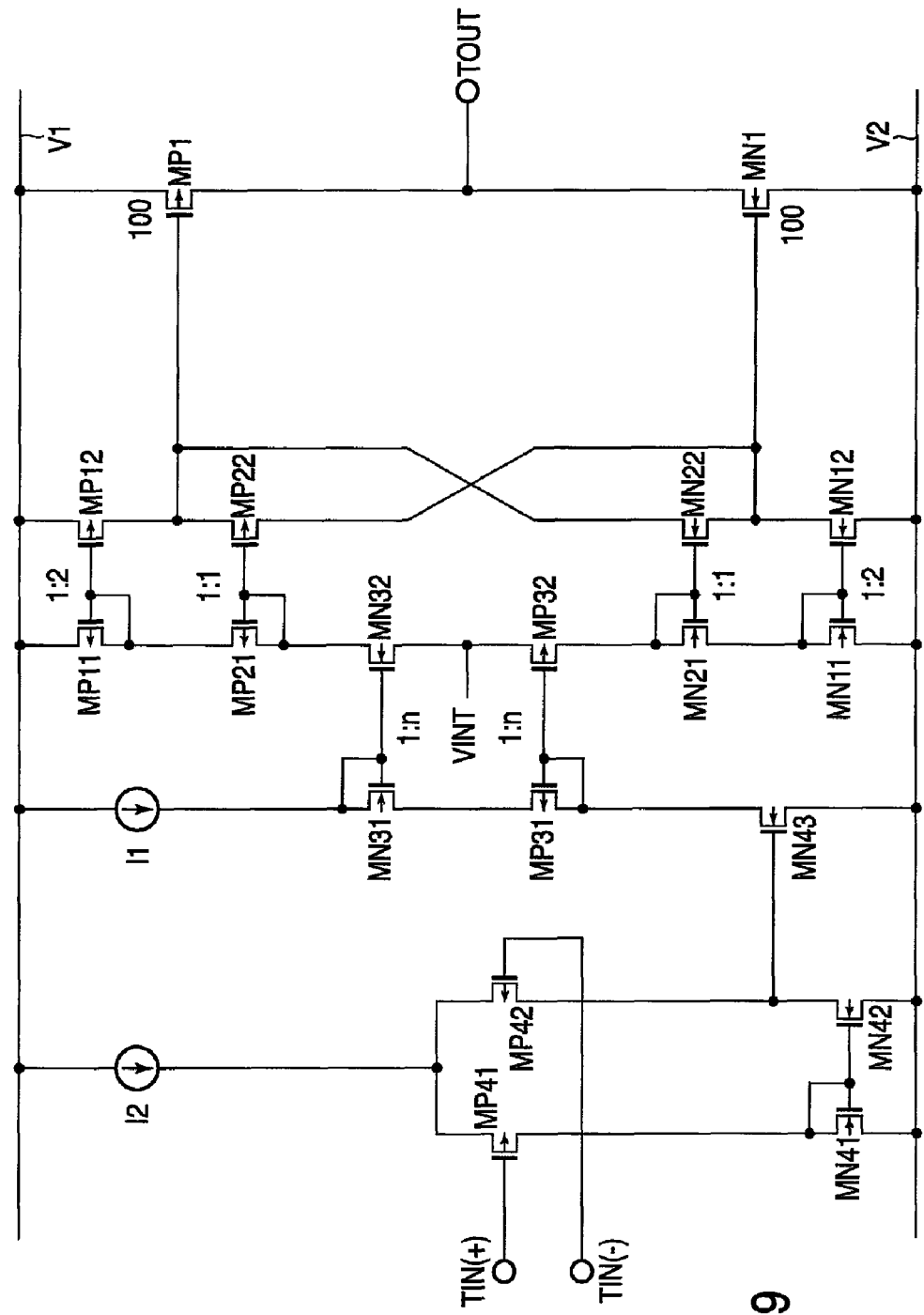
FIG. 9 is a circuit diagram showing the detailed configuration of an operational amplifier according to a fifth embodiment.

A first example of an operational amplifier including the output circuit according to the first embodiment is shown as the fifth embodiment. FIG. 9 is a circuit diagram showing the detailed configuration of the operational amplifier according to the fifth embodiment.

[6-1] Circuit Configuration

As shown in FIG. 9, a first-stage amplifier circuit comprises a differential circuit composed of MOS transistors MP41, MP42, a current mirror circuit composed of MOS transistors MN41, MN42 and a current source I2. Further, a second-stage amplifier circuit comprises a source ground circuit of a MOS transistor MN43. The circuit configuration is similar in other respects to the output circuit according to the first embodiment.

A signal is transmitted to the input terminal in the output circuit according to the first embodiment from a drain of the MOS transistor MN43. The subsequent circuit operation and advantages according to the fifth embodiment are similar to those in the first embodiment and are not described.

[7] Sixth Embodiment

A second example of an operational amplifier including the output circuit according to the first embodiment is shown as the sixth embodiment. FIG. 10 is a circuit diagram showing the detailed configuration of the operational amplifier according to the sixth embodiment.

[7-1] Circuit Configuration

As shown in FIG. 10, a first-stage amplifier circuit comprises a differential circuit composed of MOS transistors MP41, MP42, a current mirror circuit composed of MOS transistors MN41, MN42 and a current source I2. Further, a second-stage amplifier circuit comprises a source ground circuit of a MOS transistor MP43. The circuit configuration is similar in other respects to the output circuit according to the first embodiment.

A signal is transmitted to a circuit equivalent to the output circuit according to the first embodiment from a drain of the MOS transistor MP43. The subsequent circuit operation and advantages according to the sixth embodiment are similar to those in the first embodiment and are not described.

[8] Seventh Embodiment

Figure 11:
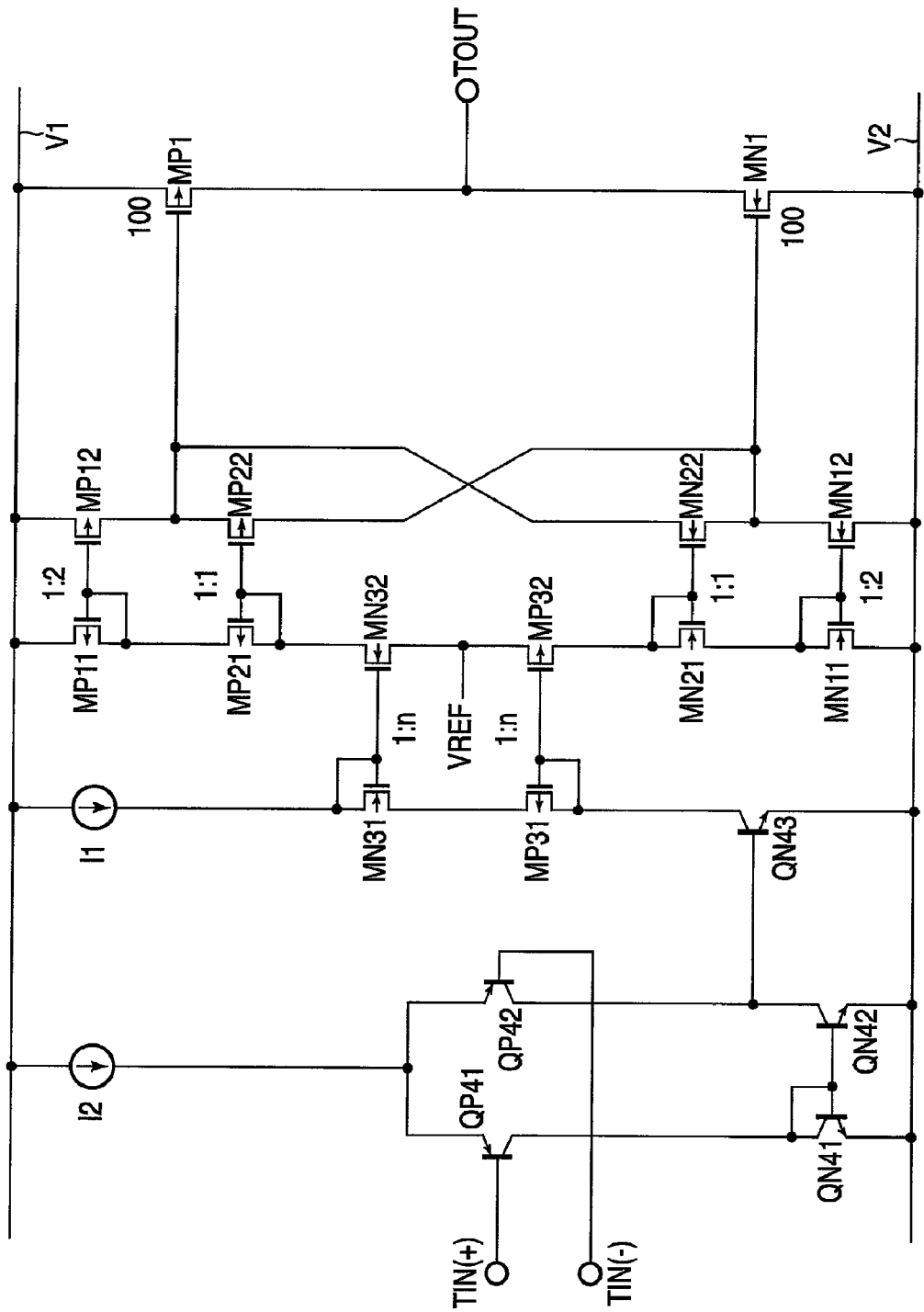
FIG. 11 is a circuit diagram showing the detailed configuration of an operational amplifier according to a seventh embodiment.

A third example of an operational amplifier including the output circuit according to the first embodiment is shown as the seventh embodiment. FIG. 11 is a circuit diagram showing the detailed configuration of the operational amplifier according to the seventh embodiment.

[8-1] Circuit Configuration

As shown in FIG. 11, a first-stage amplifier circuit comprises a differential circuit composed of pnp bipolar transistors QP41, QP42, a current mirror circuit composed of npn bipolar transistors QN41, QN42 and a current source I2. Further, a second-stage amplifier circuit comprises an emitter ground circuit of an npn bipolar transistor QN43. The circuit configuration is similar in other respects to the output circuit according to the first embodiment.

A signal is transmitted to the input terminal in the output circuit according to the first embodiment from a collector of bipolar transistor QN43. The subsequent circuit operation and advantages according to the seventh embodiment are similar to those in the first embodiment and are not described.

[9] Eighth Embodiment

Figure 12:
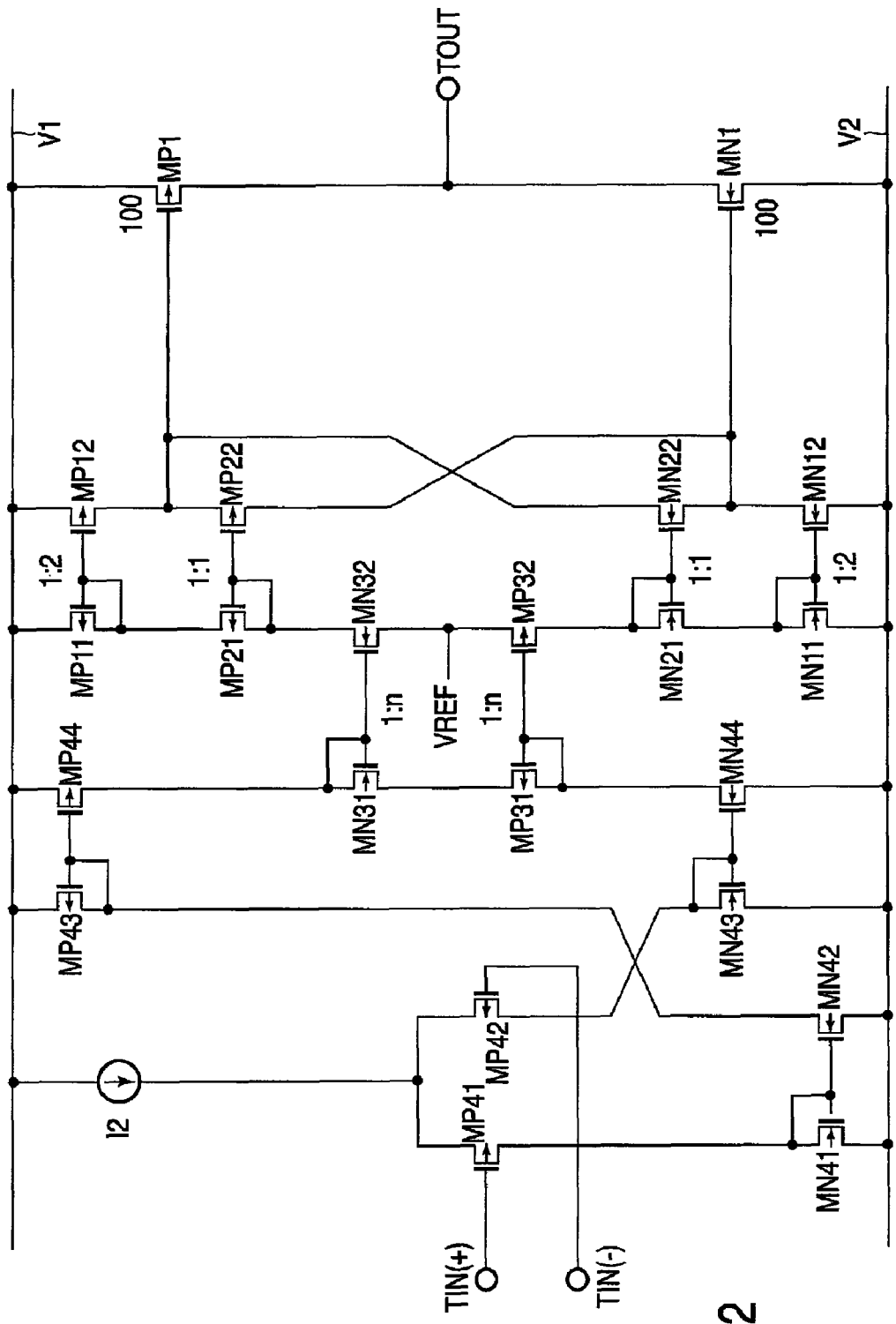
FIG. 12 is a circuit diagram showing the detailed configuration of an operational amplifier according to an eighth embodiment.

A fourth example of an operational amplifier including the output circuit according to the first embodiment is shown as the eighth embodiment. FIG. 12 is a circuit diagram showing the detailed configuration of the operational amplifier according to the eighth embodiment.

[9-1] Circuit Configuration

As shown in FIG. 12, a first-stage amplifier circuit comprises a differential circuit composed of MOS transistors MP41, MP42, a current mirror circuit composed of MOS transistors MP43, MP44, a current mirror circuit composed of MOS transistors MN43, MN44, and a current mirror circuit composed of MOS transistors MN41, MN42.

In this case, the circuit is configured so that an intermediate voltage of a MOS transistor MN31 and a MOS transistors MP31 is driven in a push-pull manner by the MOS transistor MP44 and the MOS transistor MN44, and, as shown in FIG. 7, the intermediate voltage of the MOS transistor MN31 and the MOS transistors MP31 virtually serves as the voltage of the input terminal TIN between the MOS transistors MN31 and MP31. The circuit operation and advantages according to the eighth embodiment are similar in other respects to those in the first embodiment and are not described.

According to the embodiment, it is possible to provide an output circuit in which a drive circuit of a push output transistor and a drive circuit of a pull output transistor have high symmetry so that the transfer characteristics of these output transistors when driven have good symmetry. The use of the output circuit according to the present embodiment enables an audio operational amplifier having high sound quality to be formed.

The output circuit according to the embodiments is applicable to an amplifier circuit that uses a class AB push-pull circuit, and can be used in, for example, a home audio, car audio, mobile telephone or personal digital assistant (PDA).

According to the embodiments, it is possible to provide an output circuit in which a drive circuit of a push output transistor and a drive circuit of a pull output transistor have high symmetry so that the transfer characteristics of these output transistors when driven have good symmetry.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output circuit comprising:
   a first transistor connected between a first power supply rail and an output unit;
   a second transistor connected between the output unit and a second power supply rail;
   a gm amplifier comprising an input unit and first and second output terminals, the gm amplifier being configured to amplify a difference between a signal input to the input unit and a reference voltage;
   a first current mirror circuit and a second current mirror circuit connected in series between the first power supply rail and the first output terminal of the gm amplifier, and connected to a gate of the second transistor, the second current mirror circuit comprising a first drain/collector terminal and a second drain/collector terminal through which a current flows in accordance with a current flowing through the first drain/collector terminal; and
   a third current mirror circuit and a fourth current mirror circuit connected in series between the second power supply rail and the second output terminal of the gm amplifier, and connected to a gate of the first transistor, the fourth current mirror circuit comprising a third drain/collector terminal and a fourth drain/collector terminal through which a current flows in accordance with a current flowing through the third drain/collector terminal,
   wherein the gate of the first transistor is connected to a node between the first current mirror circuit and the second current mirror circuit;
   the gate of the second transistor is connected to a node between the third current mirror circuit and the fourth current mirror circuit;
   the first output terminal of the gm amplifier is connected to the first drain/collector terminal of the second current mirror circuit; and
   the second output terminal of the gm amplifier is connected to the third drain/collector terminal of the fourth current mirror circuit.

2. The output circuit according to claim 1, wherein
   the first current mirror circuit comprises fifth and sixth drain/collector terminals and first and second source/emitter terminals;
   the second current mirror circuit comprises third and fourth source/emitter terminals;
   the third current mirror circuit comprises seventh and eighth drain/collector terminals and fifth and sixth source/emitter terminals;
   the fourth current mirror circuit comprises seventh and eighth source/emitter terminals;
   the first and second source/emitter terminals are connected to the first power supply rail, the fifth drain/collector terminal is connected to the third source/emitter terminal;
   the gate of the first transistor is connected to the sixth drain/collector terminal, the fourth source/emitter terminal, and the fourth drain/collector terminal;
   the fifth and sixth source/emitter terminals are connected to the second power supply rail, the seventh drain/collector terminal is connected to the seventh source/emitter terminal; and
   the gate of the second transistor is connected to the eighth drain/collector terminal, the eighth source/emitter terminal, and the second drain/collector terminal.

3. The output circuit according to claim 1, wherein the first current mirror circuit, the first transistor, the third current mirror circuit, and the second transistor comprise MOS field-effect transistors (MOSFETs).

4. The output circuit according to claim 1, wherein
   the second current mirror circuit, the fourth current mirror circuit, and the gm amplifier are comprise bipolar transistors.

5. The output circuit according to claim 1, wherein
   the first and second transistors are configured to pass a constant bias current when an alternating-current signal applied to the input unit is zero;
   the first transistor is configured to pass an increased current when the alternating-current signal applied to the input unit is positive, and the second transistor is configured to pass a decreased current when the alternating-current signal applied to the input unit is positive; and
   the first transistor is configured to pass a decreased amount of current when the alternating-current signal applied to the input unit is negative, and the second transistor is configured to pass an increased current when the alternating-current signal applied to the input unit is negative.

6. The output circuit according to claim 2, further comprising:
   a first cascode transistor cascoded to the second drain/collector terminal of the second current mirror circuit; and
   a second cascode transistor cascoded to the fourth drain/collector terminal of the fourth current mirror circuit.

7. The output circuit according to claim 1, wherein
   the first current mirror circuit is configured such that currents flowing through the fifth drain/collector and first source/emitter terminals are equal and currents flowing through the sixth drain/collector and second source/emitter terminals are equal, the current flowing through the sixth drain/collector terminal being determined in accordance with a potential difference between the first and second source/emitter terminals and in accordance with the current flowing through the fifth drain/collector terminal;
   the second current mirror circuit is configured such that currents flowing through the first drain/collector and third source/emitter terminals are equal and currents flowing through the second drain/collector and fourth source/emitter terminals are equal, the current flowing through the second drain/collector terminal being determined in accordance with a potential difference between the third and fourth source/emitter terminals and in accordance with the current flowing through the first drain/collector terminal;

the third current mirror circuit is configured such that currents flowing through the and seventh drain/collector and fifth source/emitter terminals are equal and currents flowing through the eighth drain/collector and sixth source/emitter terminals are equal, the current flowing through the sixth source/emitter terminal being determined in accordance with a potential difference between the seventh and eighth drain/collector terminals and in accordance with the current flowing through the fifth source/emitter terminal; and the fourth current mirror circuit is configured such that currents flowing through the third drain/collector and seventh source/emitter terminals are equal and currents flowing through the fourth drain/collector and eighth source/emitter terminals are equal, the current flowing through the eighth source/emitter terminal being determined in accordance with a potential difference between the third and fourth drain/collector terminals and in accordance with the current flowing through the seventh source/emitter terminal.

8. The output circuit according to claim 1, wherein the first power supply rail is configured to carry a power supply voltage, and the second power supply rail is configured to carry a ground voltage.

9. An output circuit comprising:
a first transistor connected between a first power supply rail and an output unit;
a second transistor connected between the output unit and a second power supply rail;
a gm amplifier comprising an input unit and first and second output terminals, the gm amplifier being configured to amplify a difference between a signal input to the input unit and a reference voltage;
a first current mirror circuit and a second current mirror circuit connected in series between the first power supply rail and the first output terminal of the gm amplifier, and connected to a gate of the second transistor; and
a third current mirror circuit and a fourth current mirror circuit connected in series between the second power supply rail and the second output terminal of the gm amplifier, and connected to a gate of the first transistor,
wherein the gate of the first transistor is connected to a node between the first current mirror circuit and the second current mirror circuit;
the gate of the second transistor is connected to a node between the third current mirror circuit and the fourth current mirror circuit;
the first current mirror circuit comprises a first pMOSFET and a second pMOSFET, wherein a gate of the first pMOSFET is connected to a drain of the first pMOSFET and to a gate of the second pMOSFET;
the second current mirror circuit comprises a third pMOSFET and a fourth pMOSFET, wherein a gate of the third pMOSFET is connected to a drain of the third pMOSFET and to a gate of the fourth pMOSFET;
the third current mirror circuit comprises a first nMOSFET and a second nMOSFET, wherein a gate of the first nMOSFET is connected to a drain of the first nMOSFET and to a gate of the second nMOSFET;
the fourth current mirror circuit comprises a third nMOSFET and a fourth nMOSFET, wherein a gate of the third nMOSFET is connected to a drain of the third nMOSFET and to a gate of the fourth nMOSFET;
the gm amplifier comprises a fifth nMOSFET, a sixth nMOSFET, a fifth pMOSFET, a sixth pMOSFET, and a current source;
a gate of the fifth nMOSFET is connected to a drain of the fifth nMOSFET, to a gate of the sixth nMOSFET, and to the current source;
a gate of the fifth pMOSFET is connected to a drain of the fifth pMOSFET, to a gate of the sixth pMOSFET and to the input unit; and
a source of the fifth nMOSFET is connected to a source of the fifth pMOSFET, wherein a source of the sixth nMOSFET is connected to a source of the sixth pMOSFET.

* * * * *